United States Patent
Kakefu et al.

(10) Patent No.: US 11,515,292 B2
(45) Date of Patent: Nov. 29, 2022

(54) SEMICONDUCTOR DEVICE

(71) Applicant: FUJI ELECTRIC CO., LTD., Kawasaki (JP)

(72) Inventors: Mitsuhiro Kakefu, Matsumoto (JP); Hiroaki Ichikawa, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/004,372

(22) Filed: Aug. 27, 2020

(65) Prior Publication Data
US 2020/0395343 A1    Dec. 17, 2020

Related U.S. Application Data

(63) Continuation of application No. PCT/JP2019/028851, filed on Jul. 23, 2019.

(30) Foreign Application Priority Data

Sep. 20, 2018 (JP) .............................. JP2018-175498

(51) Int. Cl.
*H01L 25/07* (2006.01)
*H01L 23/00* (2006.01)
*H02M 7/537* (2006.01)

(52) U.S. Cl.
CPC ............ *H01L 25/072* (2013.01); *H01L 24/48* (2013.01); *H01L 24/49* (2013.01);
(Continued)

(58) Field of Classification Search
CPC ....... H01L 25/072; H01L 24/48; H01L 24/49; H01L 2224/48137; H01L 2224/48225; H01L 2224/49112; H01L 2224/49175
See application file for complete search history.

(56) References Cited

U.S. PATENT DOCUMENTS

2007/0228534 A1* 10/2007 Uno ........................ H01L 23/50
                                                         257/678
2013/0049137 A1*  2/2013 Uno .................. H01L 23/49562
                                                         257/401
(Continued)

FOREIGN PATENT DOCUMENTS

JP    2004363339 A    12/2004
JP    2009164325 A     7/2009
(Continued)

OTHER PUBLICATIONS

International Search Report for PCT/JP2019/028851, dated Oct. 21, 2019.
Written Opinion for PCT/JP2019/028851, dated Oct. 21, 2019.

*Primary Examiner* — Marc Anthony Armand
(74) *Attorney, Agent, or Firm* — Rabin & Berdo, P.C.

(57) ABSTRACT

A semiconductor device, having a first semiconductor chip including a first side portion at a front surface thereof and a first control electrode formed in the first side portion, a second semiconductor chip including a second side portion at a front surface thereof and a second control electrode formed in the second side portion, a first circuit pattern, on which the first semiconductor chip and the second semiconductor chip are disposed, a second circuit pattern, and a first control wire electrically connecting the first control electrode, the second control electrode, and the second circuit pattern. The first side portion and the second side portion are aligned. The first control electrode and the second control electrode are aligned. The second circuit pattern are aligned with the first control electrode and the second control electrode.

18 Claims, 7 Drawing Sheets

(52) U.S. Cl.
CPC ............... *H01L 2224/48137* (2013.01); *H01L 2224/48225* (2013.01); *H01L 2224/49112* (2013.01); *H01L 2224/49175* (2013.01); *H01L 2924/13055* (2013.01); *H02M 7/537* (2013.01)

(56) References Cited

U.S. PATENT DOCUMENTS

| | | |
|---|---|---|
| 2017/0271275 A1 | 9/2017 | Inaba |
| 2017/0287828 A1* | 10/2017 | Sawada ................... H01L 25/18 |
| 2018/0204778 A1 | 7/2018 | Hasegawa et al. |
| 2019/0052189 A1 | 2/2019 | Oomori |
| 2019/0109064 A1* | 4/2019 | Kao .................... H01L 23/3731 |

FOREIGN PATENT DOCUMENTS

| | | |
|---|---|---|
| JP | 2017168792 A | 9/2017 |
| WO | 2017056176 A1 | 4/2017 |
| WO | 2017159029 A1 | 9/2017 |

* cited by examiner

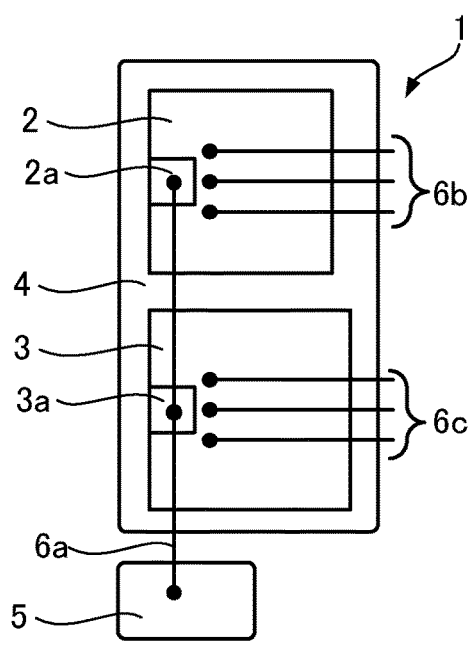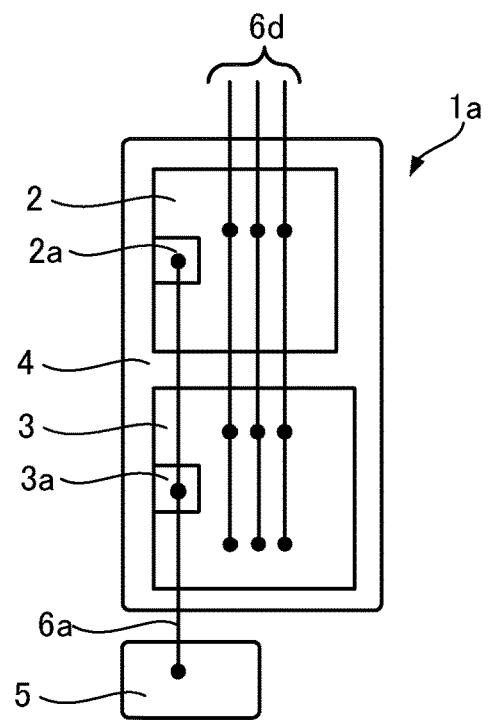
FIG. 1A  FIG. 1B
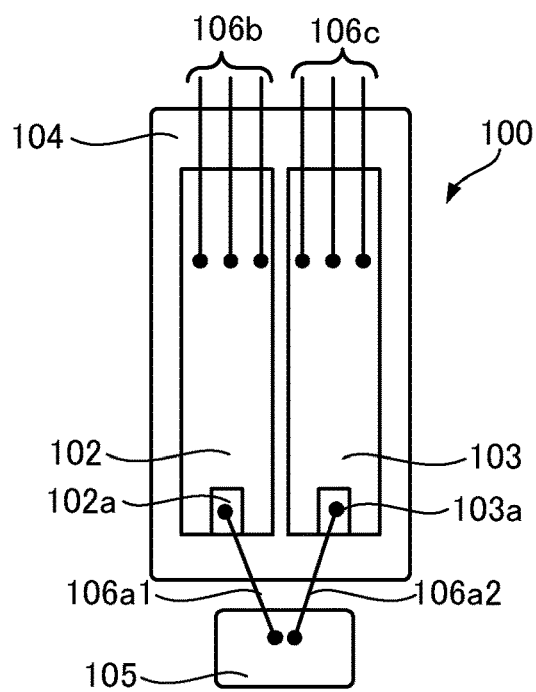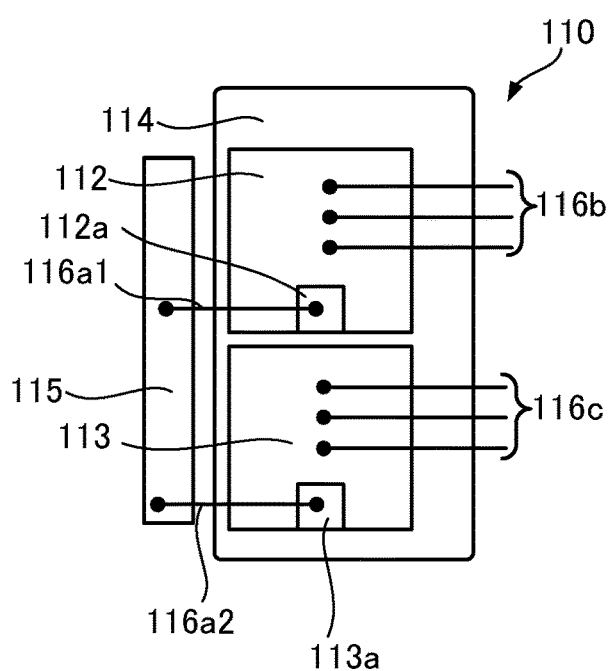
FIG. 1C  FIG. 1D

SEMICONDUCTOR DEVICE

CROSS-REFERENCE TO RELATED APPLICATION

This application is a continuation application of International Application PCT/JP2019/028851 filed on Jul. 23, 2019 which designated the U.S., which claims priority to Japanese Patent Application No. 2018-175498, filed on Sep. 20, 2018, the entire contents of which are incorporated herein by reference.

BACKGROUND OF THE INVENTION

1. Field of the Invention

The embodiments discussed herein relate to a semiconductor device.

2. Background of the Related Art

Semiconductor devices include, for example, semiconductor elements such as IGBTs (insulated gate bipolar transistors) and power MOSFETs (metal oxide semiconductor field effect transistors). Such a semiconductor device, having a plurality of semiconductor units including the above semiconductor elements on a heat dissipation plate, is able to implement desired functions (for example, see Japanese Laid-open Patent Publication No. 2004-363339).

As an example of such a semiconductor unit, an RC (reverse-conducting)-IGBT chip that integrates IGBT and FWD (freewheeling diode) on a single chip is disposed on a circuit pattern. A semiconductor device in which a plurality of such semiconductor units are disposed on a heat dissipation plate and electrically connected to each other is used as a power conversion device.

For semiconductor devices, downsizing, high-current capability, and low loss are demanded. For downsizing and high-current capability, a plurality of semiconductor chips needs to be disposed on a circuit pattern with high area efficiency. Meanwhile, in order not to increase loss, a decrease in gate response speed needs to be prevented. However, in view of both the high area efficiency and the prevention of the decrease in gate response speed, it has not been said that the arrangement of circuit patterns, semiconductor chips, and wires in a semiconductor device is optimal.

SUMMARY OF THE INVENTION

According to an aspect, there is provided a semiconductor device, including: a first semiconductor chip, including a first side portion at a front surface thereof, and a first control electrode formed in the first side portion, a second semiconductor chip, including a second side portion at a front surface thereof, and a second control electrode formed in the second side portion, a first circuit pattern, on which the first semiconductor chip and the second semiconductor chip are disposed, the first side portion and the second side portion being aligned, and the first control electrode and the second control electrode being aligned, a second circuit pattern aligned with the first control electrode and the second control electrode, and a first control wire electrically connecting the first control electrode, the second control electrode, and the second circuit pattern.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 1A to 1D are views for explaining arm parts individually included in a semiconductor device according to a first embodiment;

DETAILED DESCRIPTION OF THE INVENTION

First Embodiment

Figure 2:
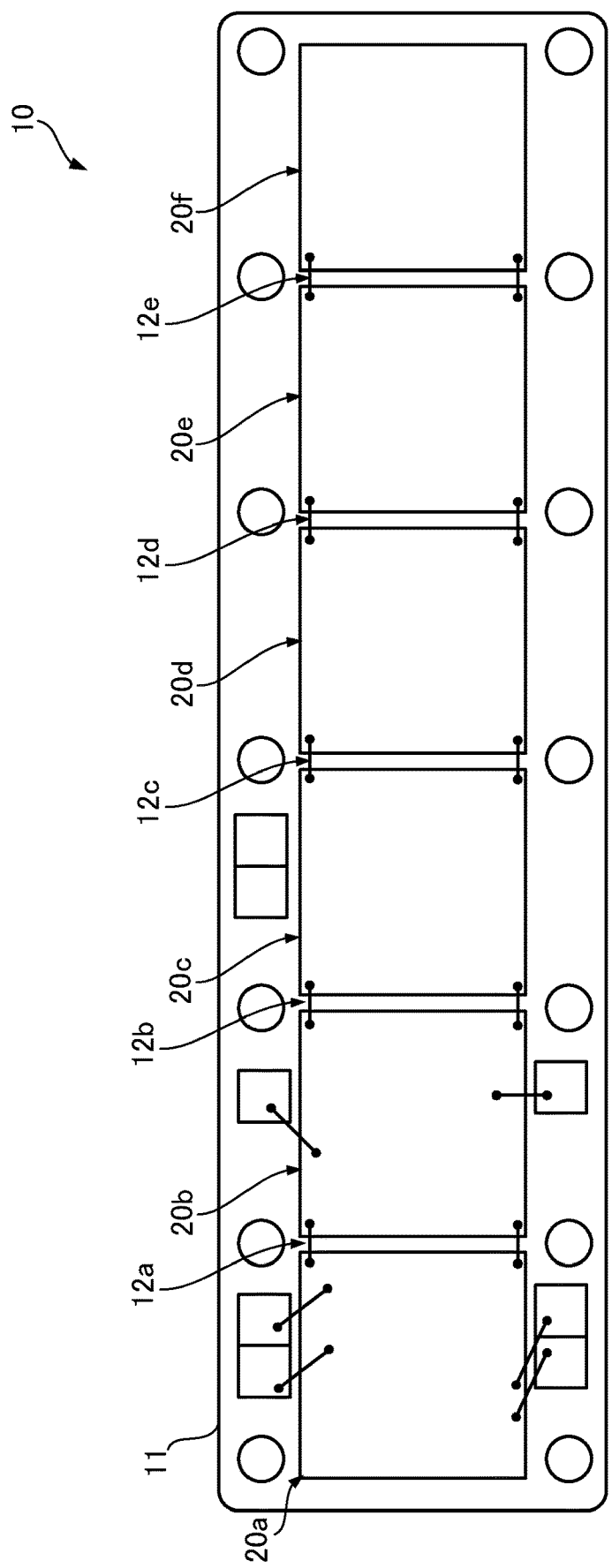
FIG. 2 is a plan view of a semiconductor device according to a second embodiment.

The following describes, with reference to the accompanying drawings, arm parts individually included in a semiconductor device according to a first embodiment with reference to FIGS. 1A to 1D. FIGS. 1A to 1D are views for explaining arm parts individually included in a semiconductor device according to the first embodiment. In this connection, FIGS. 1A and 1B illustrate arm parts 1 and 1a individually included in a semiconductor device according to the first embodiment, whereas FIGS. 1C and 1D illustrate arm parts 100 and 110 individually included in a semiconductor device for reference examples.

The semiconductor device of the first embodiment includes the arm part 1 illustrated in FIG. 1A. The arm part 1 includes semiconductor chips 2 and 3, circuit patterns 4 and 5, and a control wire 6a. The semiconductor chip 2 has a control electrode 2a at a side portion of its front surface, and the semiconductor chip 3 has a control electrode 3a at a side portion of its front surface. For example, the semiconductor chips 2 and 3 include switching elements such as IGBTs and power MOSFETs, for example. Such semiconductor chips 2 and 3 each have an input electrode (drain electrode or collector electrode) serving as a main electrode on its rear surface, and a control electrode (gate electrode) and an output electrode (source electrode or emitter electrode) serving as a main electrode on its front surface, for example. In addition, the semiconductor chips 2 and 3 include diodes such as SBDs (Schottky barrier diodes) and FWDs, as needed. Such semiconductor chips 2 and 3 each have an output electrode (cathode electrode) serving as a main electrode on its rear surface and an input electrode (anode electrode) serving as a main electrode on its front surface. In addition, the semiconductor chips 2 and 3 may include an RC-IGBT that integrates the IGBT and FWD functions into a single chip. For example, the circuit pattern 4 is rectangular in plan view, and the semiconductor chips 2 and 3 are disposed on the circuit pattern 4 such that side portions of the semiconductor chips 2 and 3 are aligned in a line and the control electrodes 2a and 3a are aligned in a line. The circuit pattern 5 is rectangular in plan view and is aligned in a line with the control electrodes 2a and 3a. The control wire 6a electrically connects the control electrodes 2a and 3a and the circuit pattern 5. In the arm part 1 illustrated in FIG. 1A, main current wires 6b and 6c are respectively connected to the main electrodes of the semiconductor chips and 3 in a direction perpendicular to the connection direction of the control wire 6a. The connection direction is a direction in which the control wire extends from one end to the other end thereof. In this connection, the term "perpendicular" direction here refers to any direction at an angle of ±30° to a direction orthogonal to the connection direction of the control wire 6a. In addition, each of the control wire 6a and main current wires 6b and 6c may be formed using a bonding wire, a lead frame, a ribbon conductor member, or another.

The semiconductor device of the first embodiment may include an arm part 1a illustrated in FIG. 1B, in place of the arm part 1. In this connection, in the arm part 1a, elements equivalent to those in the arm part 1 are designated by the same reference numerals as used in the arm part 1. In this arm part 1a, main current wires 6d are connected to the main electrodes of semiconductor chips 2 and 3 in a direction anti-parallel to the connection direction of a control wire 6a. Here, the term "anti-parallel" means that while the two directions are parallel to each other, they run in opposite directions. The term "parallel" direction refers to any direction at an angle of ±30° to a direction parallel to the connection direction of the control wire 6a. In addition, each of the control wire 6a and main current wires 6d may be formed using a bonding wire, a lead frame, a ribbon conductor member, or another.

The following describes reference examples for the above arm part 1. The arm part 100 illustrated in FIG. 1C includes semiconductor chips 102 and 103, circuit patterns 104 and 105, and control wires 106a1 and 106a2. For example, the semiconductor chips 102 and 103 are RC-IGBT chips and are vertically long in plan view. The semiconductor chip 102 has a control electrode 102a at the lower portion of its front surface and the semiconductor chip 103 has a control electrode 103a at the lower portion of its front surface as seen in FIG. 1C. The circuit pattern 104 is rectangular in plan view, and the semiconductor chips 102 and 103 are disposed such that the control electrodes 102a and 103a are aligned in a line. The circuit pattern 105 is disposed on the side of the circuit pattern 104 where the control electrodes 102a and 103a are located and apart from the circuit pattern 104. In addition, the control wire 106a1 electrically connects the control electrode 102a and the circuit pattern 105, and the control wire 106a2 electrically connects the control electrode 103a and the circuit pattern 105. In addition, in the arm part 100, main current wires 106b and 106c are respectively connected to the upper portion of the main electrodes of the semiconductor chips 102 and 103 as seen in FIG. 1C. Such an arm part 100 is able to make the most of the chip mounting area of the circuit pattern 104 for the semiconductor chips 102 and 103 and to thereby achieve high output current. However, since the semiconductor chips 102 and 103 are vertically long, a current, which flows along such a shape inside the semiconductor chips 102 and 103, has a long current path, which decreases the gate response speed. Therefore, the arm part 100 has a slow gate response speed, as compared with the arm part 1.

The arm part 110 illustrated in FIG. 1D includes semiconductor chips 112 and 113, circuit patterns 114 and 115, and control wires 116a1 and 116a2. The semiconductor chips 112 and 113 are RC-IGBT chips, for example, and are approximately square in plan view. The semiconductor chip 112 has a control electrode 112a at the lower portion of its front surface and the semiconductor chip 113 has a control electrode 113a at the lower portion of its front surface as seen in FIG. 1D. The circuit pattern 114 is rectangular in plan view, and the semiconductor chips 112 and 113 are vertically disposed such that the control electrodes 112a and 113a are located at the respective lower portions of the semiconductor chips 112 and 113 as seen in FIG. 1D. The control wires 116a1 and 116a2 extend from the control electrodes 112a and 113a to the left, as seen in FIG. 1D, according to the locations of the semiconductor chips 112 and 113. In addition, in the arm part 110, main current wires 116b and 116c are respectively connected to the right portions of the main electrodes of the semiconductor chips 112 and 113 as seen in FIG. 1D. The circuit pattern 115 is rectangular in plan view, is disposed on the left side of the circuit pattern 114 as seen in FIG. 1D, and is connected to the control wires 116a1 and 116a2. In such an arm part 110, since the semiconductor chips 112 and 113 are approximately square, a current, which flows along such a shape inside the semiconductor chips 112 and 113, has a current path shorter than that of the arm part 100, so that the decrease in gate response speed is prevented. However, the semiconductor chips 112 and 113 occupy a large part of the area of the circuit pattern 114 because of their shapes. Thus, it is not possible to make the most use of the chip mounting area. Therefore, the chip mounting area of the circuit pattern 114 is reduced, as compared with the arm part 1. In addition, in the case where three or more semiconductor chips are disposed vertically, the circuit pattern 115 connected to the control wires 116a1 and 116a2 is made vertically longer, which occupies a larger area.

As described above, the above semiconductor device includes the arm part 1 or 1a. The arm parts 1 and 1a each include the semiconductor chips 2 and 3, circuit patterns 4 and 5, and control wire 6a. The semiconductor chip 2 has the control electrode 2a at a side portion of its front surface, and the semiconductor chip 3 has the control electrode 3a at a side portion of its front surface. The circuit pattern 4 is rectangular in plan view, and the semiconductor chips 2 and 3 are disposed on the circuit pattern 4 such that the side portions of the semiconductor chips 2 and 3 are aligned in a line and the control electrodes 2a and 3a are aligned in a line. The circuit pattern 5 is aligned in a line with the control electrodes 2a and 3a. In addition, the control wire 6a electrically connects the control electrodes 2a and 3a and the circuit pattern 5. With the above arrangement, the arm parts 1 and 1a are able to prevent a decrease in gate response speed and also to reduce the possibility of non-uniform current generation. Further, it is possible to minimize an increase in temperature when a current flows and also to prevent concentration of heat generation. Still further, it is possible to make the most of the chip mounting area of the circuit pattern 4 for the semiconductor chips 2 and 3 and to thereby increase output current. As a result, a semiconductor device including such an arm part 1 or 1a exhibits improved characteristics.

Second Embodiment

In a second embodiment, the first embodiment will be described more concretely. First, a semiconductor device will be described with reference to FIG. 2. FIG. 2 is a plan view of a semiconductor device according to the second embodiment. The semiconductor device 10 includes a heat dissipation substrate 11 and semiconductor units 20a to 20f electrically connected to each other with bonding wires 12a to 12e. The heat dissipation substrate 11 may be made of aluminum, iron, silver, copper, or an alloy containing at least one of these, which has superior thermal conductivity, for example. In addition, to improve corrosion resistance, for example, plating may be performed on the surface of the heat dissipation substrate 11 using a material such as nickel. Specific examples of the material include, other than nickel, a nickel-phosphorus alloy, a nickel-boron alloy, and others. In such a heat dissipation substrate 11, fixing holes for fixing to an external device, contact regions for allowing current to flow to/from the semiconductor units 20a to 20f, and others are formed, where appropriate. The semiconductor units 20a to 20f are disposed in a line in a prescribed direction on the front surface of the heat dissipation substrate 11 via solder, silver solder, or the like, for example. On these semiconductor units 20a to 20f, semiconductor chips including prescribed semiconductor elements are disposed so as to implement desired functions. In this connection, the number of semiconductor units 20a to 20f illustrated in FIG. 2 is just an example, and a desired number of semiconductor units may be disposed. In addition, in the following description, the semiconductor units 20a to 20f are collectively referred to as a semiconductor unit 20, which will be described in detail later. The bonding wires 12a to 12e are made of metal, such as aluminum or copper, or an alloy containing at least one of these, which has superior electrical conductivity.

In addition, to improve heat dissipation, a cooling unit (not illustrated) may be attached to the rear surface of the heat dissipation substrate 11 of the semiconductor device 10 using thermal grease containing a filler of metal oxide, such as silicone. The cooling unit in this case may be made of aluminum, iron, silver, copper, or an alloy containing at least one of these, which has superior thermal conductivity, for example. As the cooling unit, a fin, a heat sink with a plurality of fins, or a cooling device employing water cooling may be used. The heat dissipation substrate 11 may be formed integrally with such a cooling unit. In this case, the heat dissipation substrate 11 is made of aluminum, iron, silver, copper, or an alloy containing at least one of these, which has superior thermal conductivity, for example. In addition, in order to improve corrosion resistance, for example, plating using a material such as nickel may be performed on the surface of the heat dissipation substrate 11 formed integrally with the cooling unit. Specific examples of the material include, other than nickel, a nickel-phosphorus alloy, a nickel-boron alloy, and others. In addition, the semiconductor units 20a to 20f and heat dissipation substrate 11 of the semiconductor device 10 may be housed in a resin case (not illustrated). The resin case in this case is molded with control terminals for receiving gate voltage and external terminals for conducting input and output voltage.

Figure 3:
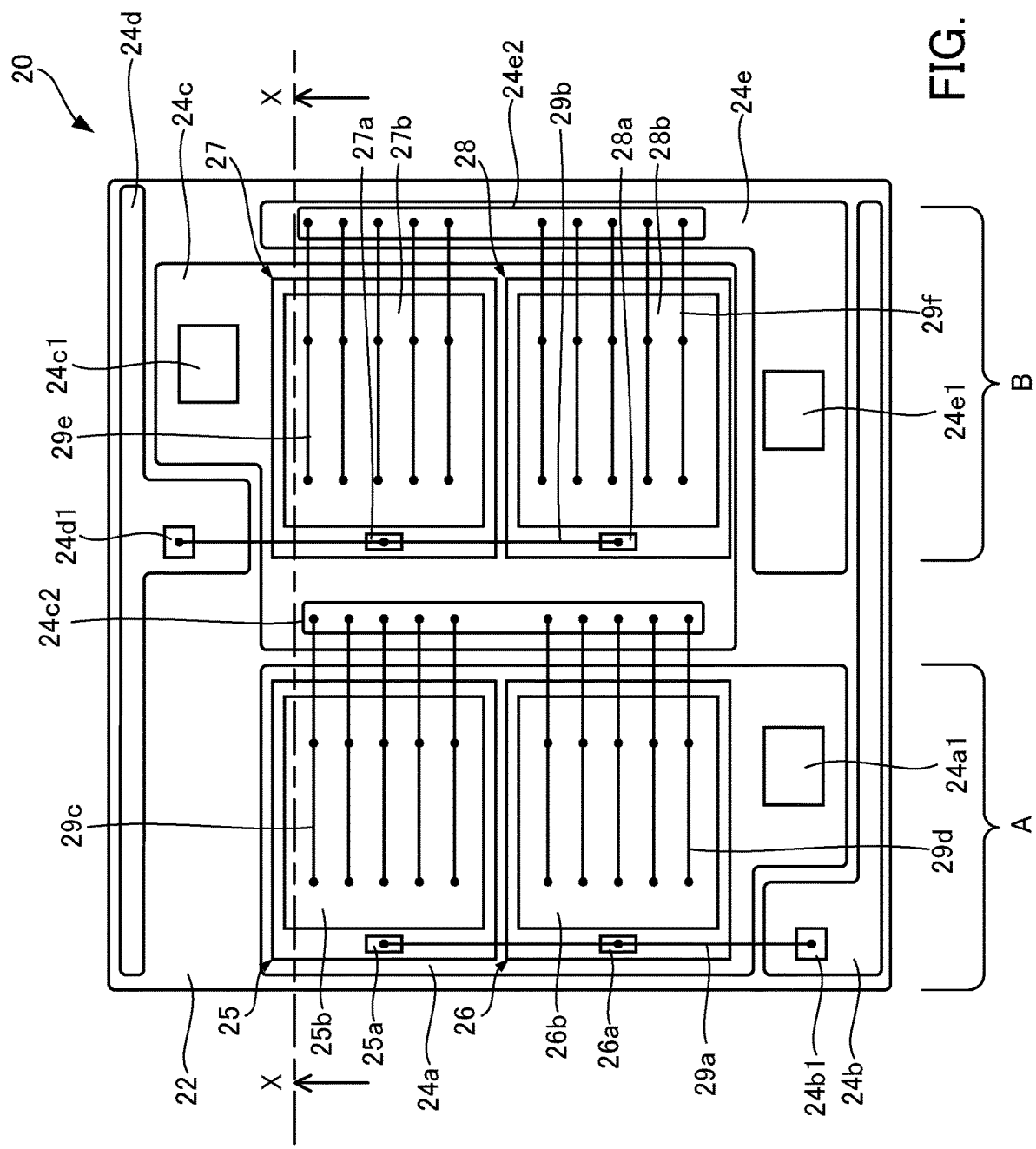
FIG. 3 is a plan view of a semiconductor unit according to the second embodiment.
Figure 4:
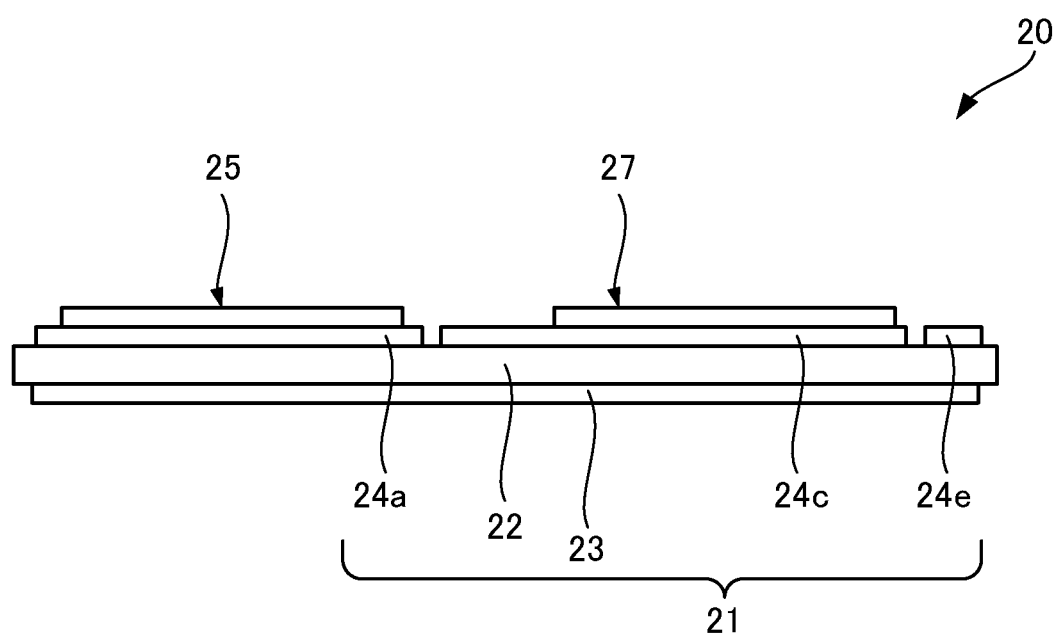
FIG. 4 is a cross-sectional view of a semiconductor unit according to the second embodiment.
Figure 5:
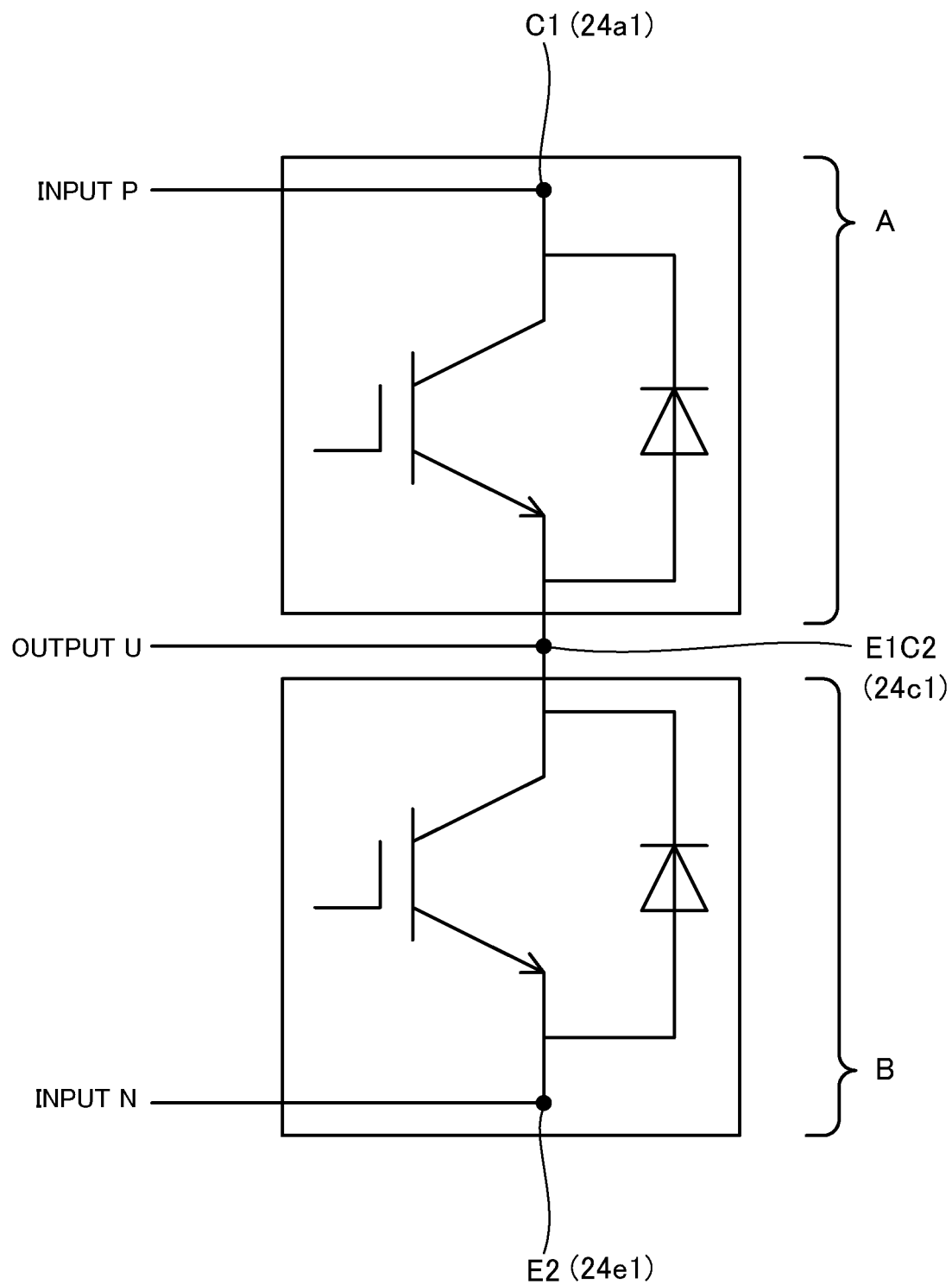
FIG. 5 is a circuit configuration diagram of a semiconductor unit according to the second embodiment.

The following describes the semiconductor unit 20 with reference to FIGS. 3 to 5. FIG. 3 is a plan view of a semiconductor unit according to the second embodiment, and FIG. 4 is a cross-sectional view of the semiconductor unit according to the second embodiment. In this connection, FIG. 4 is a cross-sectional view taken along the dot-dashed line X-X of FIG. 3. Note that bonding wires are not illustrated here. In addition, FIG. 5 is a circuit configuration diagram of a semiconductor unit according to the second embodiment. The semiconductor unit 20 includes a first arm part (upper arm part) A and a second arm part (lower arm part) B, which form upper and lower arm parts. As illustrated in FIGS. 3 and 4, the semiconductor unit 20 includes a ceramic circuit substrate 21 and semiconductor chips 25 to 28 disposed on the front surface of the ceramic circuit substrate 21. In addition, in the semiconductor unit 20, such a ceramic circuit substrate 21 is disposed on a heat dissipation substrate 11 via solder, silver solder, or the like (not illustrated) (see FIG. 2).

The semiconductor chips 25 to 28 are made of silicon or silicon carbide, and include an RC-IGBT switching element that integrates IGBT and FWD on a single chip. In the RC-IGBT chip, the collector of the IGBT is electrically connected to the cathode of the FWD and the emitter of the IGBT is electrically connected to the anode of the FWD. The RC-IGBT chip has a circuit in which IGBT and FWD are connected in inverse-parallel in this manner. Such semiconductor chips 25 to 28 each have an input electrode (drain electrode or collector electrode) serving as a main electrode on its rear surface, and a control electrode (gate electrode) and an output electrode (source electrode or emitter electrode) serving as a main electrode on its front surface, for example. In addition, the semiconductor chips 25 to 28 each have a gate electrode 25a to 28a at the center of a side portion of its front surface and an output electrode 25b to 28b in the center portion of its front surface. The ceramic circuit substrate 21 includes an electrically insulating plate 22 and a metal plate 23 formed on the rear surface of the electrically insulating plate 22. In addition, the ceramic circuit substrate 21 includes circuit patterns 24a to 24e formed on the front surface of the electrically insulating plate 22. The electrically insulating plate 22 is made of ceramics with high thermal conductivity, such as aluminum oxide, aluminum nitride, or silicon nitride, which has superior thermal conductivity. The metal plate 23 is made of metal such as aluminum, iron, silver, copper, or an alloy containing at least one of these, which has superior thermal conductivity. The circuit patterns 24a to 24e are made of metal such as copper or a copper alloy, which has superior electrical conductivity. To improve corrosion resistance, for example, plating may be performed on the surfaces of the circuit patterns 24a to 24e using a material such as nickel. Specific examples of the material include, other than nickel, a nickel-phosphorus alloy, a nickel-boron alloy, and others. The thickness of the circuit patterns 24a to 24e ranges from 0.1 mm to 1 mm, inclusive, for example. As the ceramic circuit substrate 21 configured as above, a DCB (direct copper bonding) substrate or an AMB (active metal brazed) substrate may be used, for example. The ceramic circuit substrate 21 is able to conduct heat generated by the semiconductor chips 25 to 28 to the heat dissipation substrate 11 via the circuit patterns 24a and 24c, electrically insulating plate 22, and metal plate 23. In this connection, the ceramic circuit substrate 21 is just an example, and a metal-based substrate or a lead frame with die pads may be used.

The circuit pattern 24a forms a collector pattern of the first arm part A. To the circuit pattern 24a, collector electrodes formed on the rear surfaces of the semiconductor chips 25 and 26 are joined via solder. The circuit pattern 24a is substantially rectangular, and a part thereof including a contact region 24a1 projects downward as seen in FIG. 3. On this circuit pattern 24a, the semiconductor chips 25 and 26 are disposed via solder (not illustrated) such that the gate electrodes 25a and 26a are aligned in a line. In this connection, the semiconductor chips 25 and 26 are disposed such that the gate electrodes 25a and 26a face one side parallel to the arrangement direction of the semiconductor chips 25 and 26. The gate electrodes 25a and 26a face one side (left side in FIG. 3) of the electrically insulating plate 22. In this connection, three or more semiconductor chips 25 and 26 may be disposed. In this case as well, the semiconductor chips are disposed such that the gate electrodes are aligned in a line and face one side parallel to the arrangement direction of the semiconductor chips. In this connection, the term "parallel" direction in this embodiment refers to any direction at an angle of ±30° to a parallel direction.

The circuit pattern 24b forms a control pattern of the first arm part A. To the circuit pattern 24b, a bonding wire 29a connected to the gate electrodes 25a and 26a of the semiconductor chips 25 and 26 is connected. The circuit pattern 24b has a connection region 24b1 that is located in a line with the gate electrodes 25a and 26a of the semiconductor chips 25 and 26. The circuit pattern 24b extends from a part including the connection region 24b1 perpendicularly to the arrangement direction of the semiconductor chips 25 and 26 along one side (bottom side in FIG. 3) of the electrically insulating plate 22.

The circuit pattern 24c forms an emitter pattern of the first arm part A and a collector pattern of the second arm part B. To the circuit pattern 24c, bonding wires 29c and 29d connected to the output electrodes (emitter electrodes) 25b and 26b of the semiconductor chips and 26 are connected. In addition, to the circuit pattern 24c, collector electrodes formed on the rear surfaces of the semiconductor chips 27 and 28 are joined via solder. The circuit pattern 24c is substantially rectangular, and a part thereof including a contact region 24c1 projects upward as seen in FIG. 3. The circuit pattern 24c is disposed side by side with the circuit pattern 24a and on the side (right side in FIG. 3) opposite to the gate electrodes 25a and 26a. The circuit pattern 24c also has a connection region 24c2 for the bonding wires 29c and 29d in parallel with the arrangement of the semiconductor chips 25 and 26. On this circuit pattern 24c, the semiconductor chips 27 and 28 are disposed via solder (not illustrated) such that gate electrodes 27a and 28a are aligned in a line. In this connection, the semiconductor chips 27 and 28 are disposed such that the gate electrodes 27a and 28a face one side parallel to the arrangement direction of the semiconductor chips 27 and 28. The arrangement of the gate electrodes 27a and 28a may be parallel to the arrangement of the gate electrodes 25a and 26a of the first arm part A. The gate electrodes 27a and 28a face the first arm part A (one side (left side in FIG. 3) of the electrically insulating plate 22). In this connection, three or more semiconductor chips 27 and 28 may be disposed. In this case as well, the semiconductor chips are disposed such that the gate electrodes are aligned in a line and face one side parallel to the arrangement direction of the semiconductor chips.

The circuit pattern 24d forms a control pattern of the second arm part B. To the circuit pattern 24d, a bonding wire 29b connected to the gate electrodes 27a and 28a of the semiconductor chips 27 and 28 is connected. The circuit pattern 24d has a connection region 24d1 that is located in a line with the gate electrodes 27a and 28a of the semiconductor chips 27 and 28 and on the side opposite to the connection region 24b1 with the semiconductor chips 25 to 27 therebetween. The circuit pattern 24d extends from a part including the connection region 24d1 perpendicularly to the arrangement direction of the semiconductor chips 27 and 28 along one side (upper side in FIG. 3) of the electrically insulating plate 22 as seen in FIG. 3. The term "perpendicular" direction in this embodiment refers to any direction at an angle of ±30° to a direction orthogonal to a reference direction (here, the arrangement direction). The circuit pattern 24e forms an emitter pattern of the second arm part B.

The circuit pattern 24e has a connection region 24e2 to which bonding wires 29e and 29f connected to the output electrodes (emitter electrodes) 27b and 28b of the semiconductor chips 27 and 28 are connected. The circuit pattern 24e is disposed side by side with the circuit pattern 24c and has the connection region 24e2 that is located on the side (right side in FIG. 3) opposite to the gate electrodes 27a and 28a. Therefore, the circuit pattern 24e has a part that is located on the side opposite to the circuit pattern 24a with the circuit pattern 24c therebetween. The circuit pattern 24e has an orthogonal L shape between two orthogonal sides of the circuit pattern 24c and two sides of the electrically insulating plate 22. This circuit pattern 24e has the connection region 24e2 at the right portion of the electrically insulating plate 22 as seen in FIG. 3 and a contact region 24e1 at the lower portion of the electrically insulating plate 22 as seen in FIG. 3.

The bonding wires 29a to 29f are made of metal with superior electrical conductivity, such as aluminum or copper or an alloy containing at least one of these types. These preferably have a diameter ranging between 100 μm and 1 mm, inclusive. The bonding wire 29a sequentially joins the gate electrode 25a of the semiconductor chip 25, the gate electrode 26a of the semiconductor chip 26, and the connection region 24b1 of the circuit pattern 24b, which are aligned in a line, so that they are electrically connected to each other. The bonding wire 29b sequentially connects the gate electrode 27a of the semiconductor chip 27, the gate electrode 28a of the semiconductor chip 28, and the connection region 24d1 of the circuit pattern 24d, which are aligned in a line, so that they are electrically connected to each other. The bonding wires 29c electrically connect the output electrode 25b of the semiconductor chip 25 and the circuit pattern 24c in a direction perpendicular to the connection direction of the bonding wire 29a. More specifically, for this connection, the bonding wires 29c sequentially connect a plurality of points on the output electrode 25b of the semiconductor chip 25 and the connection region 24c2 of the circuit pattern 24c. The bonding wires 29d electrically connect the output electrode 26b of the semiconductor chip 26 and the circuit pattern 24c in a direction perpendicular to the connection direction of the bonding wire 29a. More specifically, the bonding wires 29d sequentially connect a plurality of points on the output electrode 26b of the semiconductor chip 26 and the connection region 24c2 of the circuit pattern 24c, so that they are connected to each other. The bonding wires 29e electrically connect the output electrode 27b of the semiconductor chip 27 and the circuit pattern 24e in a direction perpendicular to the connection direction of the bonding wire 29b. More specifically, for this connection, the bonding wires 29e sequentially connect a plurality of points on the output electrode 27b of the semiconductor chip 27 and the connection region 24e2 of the circuit pattern 24e. The bonding wires 29f electrically connect the output electrode 28b of the semiconductor chip 28 and the circuit pattern 24e in a direction perpendicular to the connection direction of the bonding wire 29b. More specifically, for this connection, the bonding wires 29f sequentially connect a plurality of points on the output electrode 28b of the semiconductor chip 28 and the connection region 24e2 of the circuit pattern 24e.

The above-described semiconductor chips 25 to 28, circuit patterns 24a to 24e, and bonding wires 29a to 29f form an inverter circuit illustrated in FIG. 5. In the semiconductor unit 20, the semiconductor chips 25 and 26, circuit patterns 24a and 24b, and bonding wire 29a form the first arm part (upper arm part) A. In addition, in the semiconductor unit 20, the semiconductor chips 27 and 28, circuit patterns 24c and 24d, and bonding wire 29b form the second arm part (lower arm part) B. In addition, the semiconductor unit 20 is connected to an external electrical device, which is externally provided to the semiconductor device 10, by an external connection terminal (not illustrated) formed using a lead frame or the like. The external connection terminal includes a C1 terminal (corresponding to the contact region 24a1), an E2 terminal (corresponding to the contact region 24e1), and an E1C2 terminal (corresponding to the contact region 24c1). In addition, the high-potential terminal of an external power supply is connected to the C1 terminal serving as an input P terminal, and the low-potential terminal of the external power supply is connected to the E2 terminal serving as an input N terminal. Then, a load (not illustrated) is connected to the E1C2 terminal serving as an output U terminal of the semiconductor unit 20. By doing so, the semiconductor unit 20 functions as an inverter. For example, in the semiconductor unit 20 configured as above, an external connection terminal (not illustrated) may be joined to the contact regions 24a1, 24c1 and 24e1, and the semiconductor chips 25 to 28 and bonding wires 29a to 29f on the ceramic circuit substrate 21 may be sealed with a sealing member. In this case, the sealing member may be made of thermosetting resin, such as maleimide-modified epoxy resin, maleimide-modified phenolic resin, or maleimide resin.

Figure 6A:
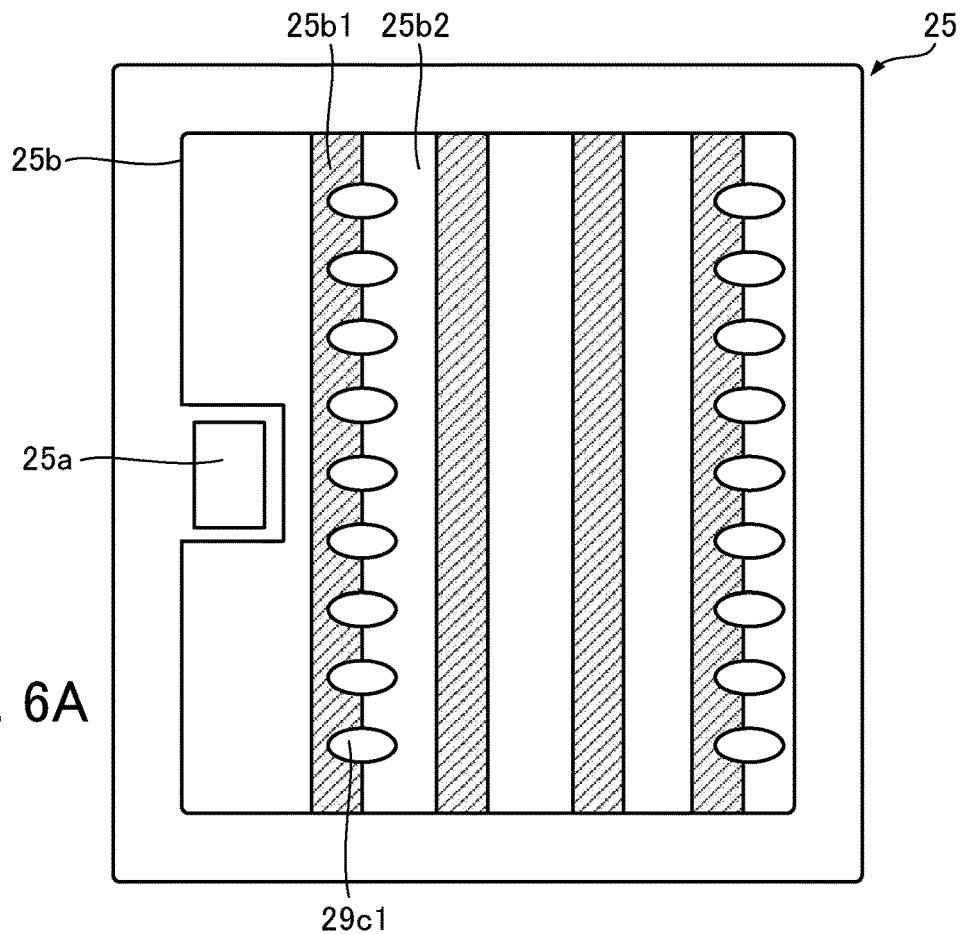
FIGS. 6A and 6B are views for explaining connections of bonding wires to the output electrode of a semiconductor chip provided in a semiconductor unit according to the second embodiment.
Figure 6B:
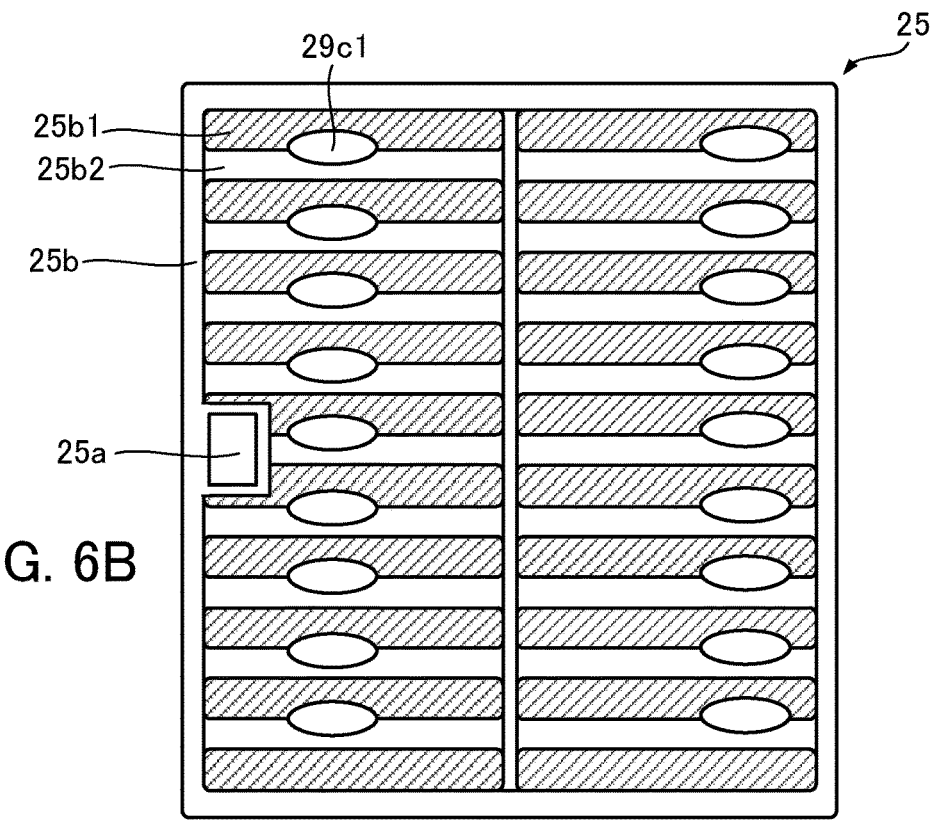

The following describes stitch bonding of the bonding wires 29c, 29d, 29e, and 29f to the output electrodes 25b to 28b of the semiconductor chips 25 to 28, with reference to FIGS. 6A and 6B. FIGS. 6A and 6B are views for explaining connections of bonding wires to the output electrode of a semiconductor chip provided in a semiconductor unit according to the second embodiment. In this connection, FIGS. 6A and 6B illustrate the semiconductor chip 25 out of the semiconductor chips 25 to 28, by way of example, and FIGS. 6A and 6B illustrate semiconductor chips 25 that are different types of RC-IGBT chips. As illustrated in FIG. 6A, the semiconductor chip 25 has an output electrode 25b where an FWD region 25b1 and an IGBT region 25b2 are repeatedly and alternately arranged. In connecting the bonding wires 29c to this output electrode 25b by stitch bonding, the bonding wires 29c are each bonded to bonding points 29c1 on the border between the FWD region 25b1 and the IGBT region 25b2. Likewise, as illustrated in FIG. 6B, in an output electrode 25b of different type from that in FIG. 6A in the semiconductor chip 25, bonding wires are each bonded to bonding points 29c1 on the border between an FWD region 25b1 and an IGBT region 25b2. This minimizes an imbalance of heat generation by the output electrode 25b of the semiconductor chip 25 in the bonding wires 29c, which makes it possible to prevent occurrence of a failure and others due to the heat generated by the semiconductor chip 25. In this connection, the same applies to the other semiconductor chips 26 to 28.

In the above-described semiconductor device 10, a plurality of semiconductor units 20 are disposed in one direction on the heat dissipation substrate 11. In addition, the semiconductor units 20 each have first and second arm parts (upper and lower arm parts) A and B. The first arm part (upper arm part) A includes the semiconductor chips 25 and 26, circuit patterns 24a and 24b, and bonding wire 29a. The semiconductor chips 25 and are RC-IGBT chips, are approximately square, and respectively have the gate electrodes 25a and 26a at side portions of their front surfaces. The circuit pattern 24a is rectangular in plan view so that the side portions of the semiconductor chips 25 and 26, which are approximately square, are aligned in a line and the gate electrodes 25a and 26a are aligned in a line, and the semiconductor chips 25 and 26 are disposed thereon. The connection region 24b1 of the circuit pattern 24b is aligned in a line with the gate electrodes 25a and 26a. In addition, the bonding wire 29a electrically connects the gate electrodes 25a and 26a and the connection region 24b1 of the circuit pattern 24b by stitch bonding. Likewise, the second arm part (lower arm part) B includes the semiconductor chips 27 and 28, which are approximately square, circuit patterns 24c and 24d, and bonding wire 29b. The semiconductor chips 27 and 28 are RC-IGBT chips, are approximately square, and respectively have the gate electrodes 27a and 28a at side portions of their front surfaces. The circuit pattern 24c is rectangular in plan view so that the side portions of the semiconductor chips 27 and 28 are aligned in a line and the gate electrodes 27a and 28a are aligned in a line, and the semiconductor chips 27 and 28 are disposed thereon. The connection region 24d1 of the circuit pattern 24d is aligned in a line with the gate electrodes 27a and 28a. In addition, the bonding wire 29b electrically connects the gate electrodes 27a and 28a and the connection region 24d1 of the circuit pattern 24d by stitch bonding.

With the above configuration, the first arm part (upper arm part) A and the second arm part (lower arm part) B are able to prevent a decrease in gate response speed and also to reduce the possibility of non-uniform current generation. Thereby, it is possible to minimize an increase in temperature when a current flows and also to prevent concentration of heat generation. In addition, it is possible to make the most of the chip mounting areas of the circuit patterns 24a and 24c for the semiconductor chips 25 to 28 and to thereby increase output current. In addition, in the semiconductor unit 20, the bonding wire 29a provided on the gate electrodes 25a and 26a of the semiconductor chips 25 and 26 and the bonding wire 29b provided on the gate electrodes 27a and 28a of the semiconductor chips 27 and 28 are in opposite directions. Therefore, in the semiconductor unit 20, the circuit pattern 24a and semiconductor chips 25 and 26 and the circuit pattern 24c and semiconductor chips 27 and 28 are disposed substantially point symmetrically, and so are the bonding wires 29a and 29b. This arrangement minimizes an imbalance of heat generation when a current flows in the semiconductor unit 20. This makes it possible to prevent occurrence of a failure and others due to the imbalance of heat generation in the semiconductor unit 20.

In addition, in the semiconductor unit 20, the bonding wires 29c to 29f are connected to the output electrodes 25b to 28b of the semiconductor chips 25 to 28 by stitch bonding in such a way that each wire is bonded on the border between an FWD region and an IGBT region. This minimizes the imbalance of heat generation by the output electrodes 25b to 28b of the semiconductor chips 25 to 28 in the bonding wires 29c to 29f, which in turn makes it possible to prevent occurrence of a failure and others due to heat generated by the semiconductor chips 25 to 28.

In this connection, the number of semiconductor chips 25 to 28 of the semiconductor unit 20 is just an example and is not limited to the case where two semiconductor chips are disposed in each arm part and two arm parts are included. For example, three or more semiconductor chips may be disposed in each arm part. In this case as well, the semiconductor chips are disposed such that the gate electrodes are aligned in a line and face one side parallel to the arrangement direction of the semiconductor chips. In addition, for example, an IGBT chip and an FWD chip may be disposed together as semiconductor chips in each arm part. In this case as well, a plurality of IGBT chips are disposed such that the gate electrodes are aligned in a line and face one side parallel to the arrangement direction of the IGBT chips. The plurality of FWD chips may be disposed in a line that is parallel to and different from the line of the IGBT chips or in a line with the IGBT chips. In addition, for example, the semiconductor unit 20 may be formed by three or more arm parts. In this case, the three or more arm parts are arranged in a direction perpendicular to the arrangement direction of the semiconductor chips.

Third Embodiment

Figure 7:
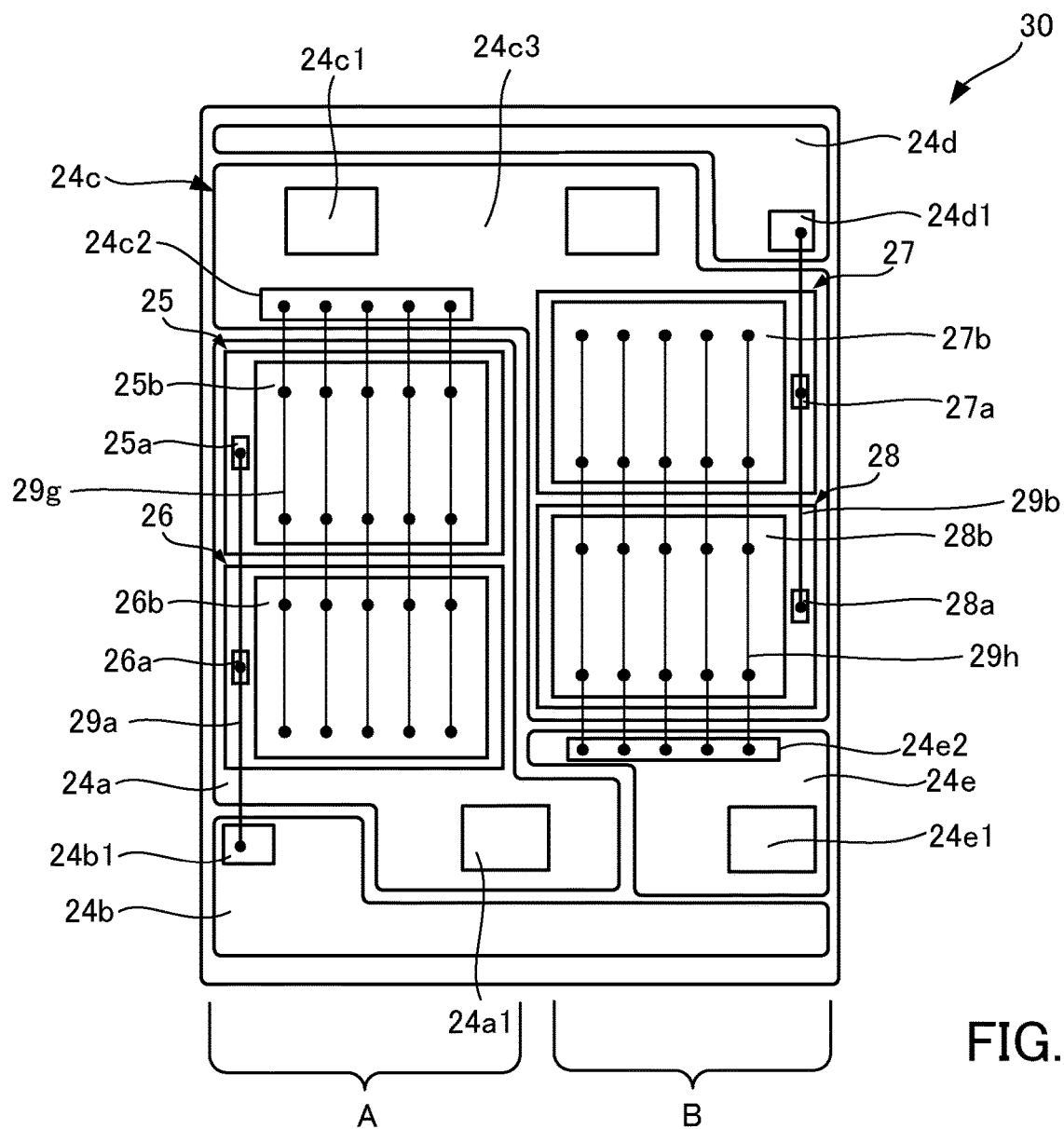
FIG. 7 is a plan view of a semiconductor unit according to a third embodiment.

A third embodiment describes a semiconductor unit that is different from the semiconductor unit 20 of the second embodiment, with reference to FIG. 7. More specifically, in a semiconductor unit of the third embodiment, the connection direction of bonding wires connected to the output electrodes of semiconductor chips is anti-parallel to that of a bonding wire connected to the gate electrodes of the semiconductor chips. FIG. 7 is a plan view of a semiconductor unit according to the third embodiment. In this connection, in the semiconductor unit 30 of the third embodiment, elements equivalent to those in the semiconductor unit 20 of the second embodiment are designated by the same reference numerals as used in the semiconductor unit 20 of the second embodiment, and their explanation is omitted. In addition, the semiconductor unit 30 includes a ceramic circuit substrate (FIG. 4) that is equivalent to that in the semiconductor unit 20 except for the shapes of circuit patterns, and implements the same circuit configuration (FIG. 5).

The semiconductor unit 30 includes a first arm part (upper arm part) A and a second arm part (lower arm part) B, which form upper and lower arm parts. A circuit pattern 24$a$ forms a collector pattern of the first arm part A. To the circuit pattern 24$a$, collector electrodes formed on the rear surfaces of the semiconductor chips 25 and 26 are joined via solder. The circuit pattern 24$a$ is substantially rectangular and a part thereof including a contact region 24$a$1 projects downward as seen in FIG. 7. In this circuit pattern 24$a$, semiconductor chips 25 and 26 are disposed via solder (not illustrated) such that gate electrodes 25$a$ and 26$a$ are aligned in a line. In this connection, the semiconductor chips 25 and 26 are disposed such that the gate electrodes 25$a$ and 26$a$ face one side parallel to the arrangement direction of the semiconductor chips 25 and 26. The gate electrodes 25$a$ and 26$a$ face one side (left side in FIG. 7) of an electrically insulating plate 22. In this connection, three or more semiconductor chips 25 and 26 may be disposed. In this case as well, the semiconductor chips are disposed such that the gate electrodes are aligned in a line and face one side parallel to the arrangement direction of the semiconductor chips. In addition, the term "parallel" direction in this embodiment refers to any direction at an angle of ±30° to a parallel direction.

The circuit pattern 24$b$ forms a control pattern of the first arm part A. To the circuit pattern 24$b$, a bonding wire 29$a$ connected to the gate electrodes 25$a$ and 26$a$ of the semiconductor chips 25 and 26 is connected. The circuit pattern 24$b$ has a connection region 24$b$1 that is located in a line with the gate electrodes 25$a$ and 26$a$ of the semiconductor chips 25 and 26. The circuit pattern 24$b$ extends from a part including the connection region 24$b$1 perpendicularly to the arrangement direction of the semiconductor chips 25 and 26 along one side (lower side in FIG. 7) of the electrically insulating plate 22 as seen in FIG. 7.

The circuit pattern 24$c$ forms an emitter pattern of the first arm part A and a collector pattern of the second arm part B. To the circuit pattern 24$c$, bonding wires 29$g$ connected to the output electrodes (emitter electrodes) 25$b$ and 26$b$ of the semiconductor chips 25 and 26 are connected. In addition, to the circuit pattern 24$c$, collector electrodes formed on the rear surfaces of the semiconductor chips 27 and 28 are joined via solder. The circuit pattern 24$c$ has a substantially L shape along a right side and upper side of the semiconductor unit 30 as seen in FIG. 7. The right region of the circuit pattern 24$c$ is located on the side opposite to the gate electrodes 25$a$ and 26$a$. The semiconductor chips 27 and 28 are disposed in that region. The upper region of the circuit pattern 24$c$ is an extension region 24$c$3 that extends from the top of the right region along the top side of the semiconductor unit 30 in the left direction. That is, the extension region 24$c$3 is located on the side of the circuit pattern 24$a$ opposite to the connection direction of the bonding wire 29$a$ and extends in a direction orthogonal to the connection direction. The extension region 24$c$3 of the circuit pattern 24$c$ has a contact region 24$c$1 to which an external connection terminal (not illustrated) is connected and a connection region 24$c$2 for the bonding wires 29$g$. The extension region 24$c$3 of the circuit pattern 24$c$ includes the connection region 24$c$2 that is located on an extension line parallel to the arrangement of the semiconductor chips 25 and 26 and that is connected to the bonding wires 29$g$ connected to the output electrodes (emitter electrodes) 25$b$ and 26$b$ of the semiconductor chips 25 and 26. On this circuit pattern 24$c$, the semiconductor chips 27 and 28 are disposed via solder (not illustrated) such that the gate electrodes 27$a$ and 28$a$ are aligned in a line. In this connection, the semiconductor chips 27 and 28 are disposed such that the gate electrodes 27$a$ and 28$a$ face one side parallel to the arrangement direction of the semiconductor chips 27 and 28. The arrangement of the gate electrodes 27$a$ and 28$a$ may be parallel to that of the gate electrodes 25$a$ and 26$a$ of the first arm part A. The gate electrodes 27$a$ and 28$a$ are located on the side opposite to the gate electrodes 25$a$ and 26$a$ and face a side (one side (right side in FIG. 7) of the electrically insulating plate 22) opposite to the first arm part A. In this connection, three or more semiconductor chips 27 and 28 may be disposed. In this case as well, the semiconductor chips may be disposed such that the gate electrodes are aligned in a line and face one side parallel to the arrangement direction of the semiconductor chips.

The circuit pattern 24$d$ forms a control pattern of the second arm part B. To the circuit pattern 24$d$, a bonding wire 29$b$ connected to the gate electrodes 27$a$ and 28$a$ of the semiconductor chips 27 and 28 is connected. The circuit pattern 24$d$ has a connection region 24$d$1 that is located in a line with the gate electrodes 27$a$ and 28$a$ of the semiconductor chips 27 and 28 and in a point symmetry with the connection region 24$b$1. The circuit pattern 24$d$ extends from a part including the connection region 24$d$1 perpendicularly to the arrangement direction of the semiconductor chips 27 and 28 along one side (top side in FIG. 7) of the electrically insulating plate 22. In this connection, the term "perpendicular" direction in this embodiment refers to any direction at an angle of ±30° to a direction orthogonal to a reference direction (here, arrangement direction). The circuit pattern 24$e$ forms an emitter pattern of the second arm part B. The circuit pattern 24$e$ has a connection region 24$e$2 to which bonding wires 29$h$ connected to the output electrodes (emitter electrodes) 27$b$ and 28$b$ of the semiconductor chips 27 and 28 are connected. The circuit pattern 24$e$ is located side by side with the circuit pattern 24$c$ and the projecting part of the circuit pattern 24$a$, and has a connection region 24$e$2 that is located on the side (bottom side in FIG. 7)

opposite to the circuit pattern 24d. This circuit pattern 24e also has a contact region 24e1 at the lower right portion of the electrically insulating plate 22 as seen in FIG. 7.

The bonding wires 29a, 29b, 29g and 29h are configured as in the bonding wires 29a to 29f of the second embodiment. The bonding wire 29a sequentially connects the gate electrode 25a of the semiconductor chip 25, the gate electrode 26a of the semiconductor chip 26, and the connection region 24b1 of the circuit pattern 24b, which are aligned in a line, so that they are electrically connected to each other. The bonding wire 29b sequentially connects the gate electrode 27a of the semiconductor chip 27, the gate electrode 28a of the semiconductor chip 28, and the connection region 24d1 of the circuit pattern 24d, which are aligned in a line, so that they are electrically connected to each other.

The bonding wires 29g electrically connect the output electrode 25b of the semiconductor chip 25, the output electrode 26b of the semiconductor chip 26, and the circuit pattern 24c in a direction anti-parallel to the connection direction of the bonding wire 29a. More specifically, for this connection, the bonding wires 29g sequentially connect a plurality of points on the output electrode 25b of the semiconductor chip 25, a plurality of points on the output electrode 26b of the semiconductor chip 26, and the connection region 24c2 of the circuit pattern 24c. The bonding wires 29h electrically connect the output electrode 27b of the semiconductor chip 27, the output electrode 28b of the semiconductor chip 28, and the circuit pattern 24e in a direction anti-parallel to the connection direction of the bonding wire 29b. More specifically, for this connection, the bonding wires 29h sequentially connect a plurality of points on the output electrode 27b of the semiconductor chip 27, a plurality of points on the output electrode 28b of the semiconductor chip 28, and the connection region 24e2 of the circuit pattern 24e. In this connection, stitch bonding as described with reference to FIGS. 6A and 6B is performed for these bonding wires 29g and 29h.

As described above, the semiconductor chips 25 to 28, circuit patterns 24a to 24e, and bonding wires 29a, 29b, 29g, and 29h form an inverter circuit illustrated in FIG. 5, as in the second embodiment. In the semiconductor unit 30, the semiconductor chips 25 and 26, circuit patterns 24a and 24b, and bonding wire 29a form the first arm part (upper arm part) A. In addition, in the semiconductor unit 30, the semiconductor chips 27 and 28, the circuit patterns 24c and 24d, and bonding wire 29b form the second arm part (lower arm part) B. In addition, the semiconductor unit 30 is connected to an external electrical device, which is externally provided to the semiconductor device 10, by an external connection terminal (not illustrated) formed using a lead frame or the like. The external connection terminal includes a C1 terminal (corresponding to the contact region 24a1), an E2 terminal (corresponding to the contact region 24e1), and an E1C2 terminal (corresponding to the contact region 24c1). Then, the high-potential terminal of an external power supply is connected to the C1 terminal serving as an input P terminal and the low-potential terminal of the external power supply is connected to an E2 terminal serving as an input N terminal. Then, a load (not illustrated) is connected to the E1C2 terminal serving as an output U terminal of the semiconductor unit 30. Thereby, the semiconductor unit 30 functions as an inverter. In the semiconductor unit 30 configured as above, for example, an external connection terminal (not illustrated) may be joined to the contact regions 24a1, 24c1, and 24e1, and the semiconductor chips 25 to 28 and bonding wires 29a, 29b, 29g, and 29h on the ceramic circuit substrate 21 may be sealed with a sealing member.

In a semiconductor device 10 including the above semiconductor unit 30, the first arm part (upper arm part) A and the second arm part (lower arm part) B are able to prevent a decrease in gate response speed, as in the second embodiment and therefore to reduce the possibility of non-uniform current generation. Thereby, it is possible to minimize an increase in temperature when a current flows and also to prevent concentration of heat generation. In addition, it is possible to make the most of the chip mounting areas of the circuit patterns 24a and 24c for the semiconductor chips 25 to 28 and to thereby increase output current. In addition, in the semiconductor unit 30, the bonding wire 29a provided on the gate electrodes 25a and 26a of the semiconductor chips 25 and 26 and the bonding wire 29b provided on the gate electrodes 27a and 28a of the semiconductor chips 27 and 28 are in opposite directions. Therefore, in the semiconductor unit 30, the circuit pattern 24a and semiconductor chips 25 and 26 and the circuit pattern 24c and semiconductor chips 27 and 28 are disposed substantially point symmetrically, and so are the bonding wires 29a and 29b. This minimizes an imbalance of heat generation when a current flows in the semiconductor chip 30. Thus, it is possible to prevent occurrence of a failure and others due to the imbalance of heat generation in the semiconductor unit 30.

The disclosed technique makes it possible to increase output current by making the most of a chip mounting area for semiconductor chips while preventing a decrease in gate response speed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device, comprising:
  a first semiconductor chip, including a first side portion at a front surface thereof, and a first control electrode formed in the first side portion,
  a second semiconductor chip, including a second side portion at a front surface thereof, and a second control electrode formed in the second side portion,
  a first circuit pattern, on which the first semiconductor chip and the second semiconductor chip are disposed, the first side portion and the second side portion being aligned in a first direction, and the first control electrode and the second control electrode being aligned in the first direction,
  a second circuit pattern aligned with the first control electrode and the second control electrode in the first direction, and
  a first control wire extending in the first direction, and electrically sequentially connecting the first control electrode, the second control electrode, and the second circuit pattern.

2. The semiconductor device according to claim 1, wherein
the first semiconductor chip further has a first main electrode formed on the front surface thereof,
the second semiconductor chip further has a second main electrode formed on the front surface thereof, and
the semiconductor device further includes
a first main current wire connected to the first main electrode formed in a second direction perpendicular to the first direction, and
a second main current wire connected to the second main electrode in the second direction.

3. The semiconductor device according to claim 2, wherein:
the first semiconductor chip and the second semiconductor chip each include a reverse-conducting insulated gate bipolar transistor (RC-IGBT) chip that integrates an IGBT region and a freewheeling diode (FWD) region;
the first main current wire and the second main current wire connect the first main electrode and the second main electrode, respectively, each at a plurality of points thereof; and
the plurality of points of the first main electrode or of the second main electrode are on a border between the FWD region and the IGBT region that form the first main electrode or the second main electrode.

4. The semiconductor device according to claim 2, wherein
the first and second semiconductor chips, the first and second circuit patterns, and the first control wire form a first arm part of the semiconductor device, and
the semiconductor device further includes a second arm part that has
a third semiconductor chip, including a third side portion at a front surface thereof, and a third control electrode formed in the third side portion,
a fourth semiconductor chip, including a fourth side portion at a front surface thereof, and a fourth control electrode formed in the fourth side portion,
a third circuit pattern, on which the third semiconductor chip and the fourth semiconductor chip are disposed, the third side portion and the fourth side portion being aligned in the first direction, and the third control electrode and the fourth control electrode being aligned in the first direction, both in parallel with the aligned first and second side portions,
a fourth circuit pattern aligned with the third control electrode and the fourth control electrode in the first direction, and
a second control wire extending in the first direction, and electrically sequentially connecting the third control electrode, the fourth control electrode, and the fourth circuit pattern,
wherein the semiconductor device has first and second sides opposite to each other in the first direction in a plan view thereof, the second and fourth circuit patterns being respectively located on the first and second sides, and
wherein the third circuit pattern is electrically connected to the first main current wire and the second main current wire.

5. The semiconductor device according to claim 4, wherein:
the first circuit pattern includes a first projecting part having a first contact region, the first projecting part being on the first side of the semiconductor device and being arranged substantially in line with the first semiconductor chip and the second semiconductor chip; and
the third circuit pattern includes a second projecting part having a second contact region, the second projecting part being on the second side of the semiconductor device and being arranged substantially in line with the third semiconductor chip and the fourth semiconductor chip.

6. The semiconductor device according to claim 5, wherein, in the second arm part, the third control electrode and the fourth control electrode are located on a same side as the first arm part, with respect to the third circuit pattern.

7. The semiconductor device according to claim 6, wherein:
the third semiconductor chip further has a third main electrode formed on the front surface thereof,
the fourth semiconductor chip further has a fourth main electrode formed on the front surface thereof, and
the semiconductor device further includes
a third main current wire electrically connecting the third main electrode in the second direction, and
a fourth main current wire electrically connecting the fourth main electrode in the second direction.

8. The semiconductor device according to claim 7, wherein:
the first semiconductor chip, the second semiconductor chip, the third semiconductor chip, and the fourth semiconductor chip are each a reverse-conducting insulated gate bipolar transistors (RC-IGBT) that integrates an IGBT region and a freewheeling diode (FWD) region;
the first main current wire, the second main current wire, the third main current wire, and the fourth main current wire connect the first main electrode, the second main electrode, the third main electrode, and the fourth main electrode, respectively, each at a plurality of points thereof; and
the plurality of points of the first, second, third or fourth main electrode are on a border between the FWD region and the IGBT region that form the first, second, third, or fourth main electrode.

9. The semiconductor device according to claim 7, wherein
the third circuit pattern has two orthogonal sides,
the second arm part further includes a fifth circuit pattern having an L shape along the two orthogonal sides of the third circuit pattern, one leg of the L shape forming a third projecting part having a third contact region, the third projecting part being located on the first side of the semiconductor device, opposite to the second projecting part with the third semiconductor chip and the fourth semiconductor chip therebetween.

10. The semiconductor device according to claim 4, wherein:
the second circuit pattern extends from a part thereof including a region to which the first control wire is connected, perpendicularly to the first direction; and
the fourth circuit pattern extends from a part thereof including a region to which the second control wire is connected, perpendicularly to the first direction.

11. The semiconductor device according to claim 4, wherein the first arm part and the second arm part are repeatedly and alternately arranged in a prescribed direction.

12. The semiconductor device according to claim 1, wherein
the first semiconductor chip further has a first main electrode formed on the front surface thereof, the second semiconductor chip further has a second main electrode formed on the front surface thereof, and
the semiconductor device further includes
a first main current wire connecting the first main electrode to the second main electrode in a direction anti-parallel to the first direction.

13. The semiconductor device according to claim 12, wherein
the first and second semiconductor chips, the first and second circuit patterns, and the first control wire form a first arm part, and
the semiconductor device further includes a second arm part that has
a third semiconductor chip, including a third side portion at a front surface thereof, and a third control electrode formed in the third side portion,
a fourth semiconductor chip, including a fourth side portion at a front surface thereof, and a fourth control electrode formed in the fourth side portion,
a third circuit pattern, on which the third semiconductor chip and the fourth semiconductor chip are disposed, the third side portion and the fourth side portion being aligned, and the third control electrode and the fourth control electrode being aligned, both in parallel with the aligned first and second side portions,
a fourth circuit pattern aligned with the third control electrode and the fourth control electrode, and
a second control wire electrically connecting the third control electrode, the fourth control electrode, and the fourth circuit pattern,
wherein the semiconductor device has first and second sides opposite to each other in a plan view thereof, the second and fourth circuit patterns being respectively located on the first and second sides.

14. The semiconductor device according to claim 13, wherein:
the third circuit pattern includes an extension region that extends in the second direction, to be located beside the first circuit pattern; and
the first main current wire is electrically connected to the extension region.

15. The semiconductor device according to claim 14, wherein, in the second arm part, the third control electrode and the fourth control electrode are located on a side opposite to that of the first arm part, with respect to the third circuit pattern.

16. The semiconductor device according to claim 15, wherein:
the second arm part further includes a fifth circuit pattern disposed on the first side of the semiconductor device;
the third semiconductor chip further has a third main electrode formed on the front surface thereof,
the fourth semiconductor chip further has a fourth main electrode formed on the front surface thereof, and
the semiconductor device further includes a second main current wire electrically connecting the third main electrode, the fourth main electrode, and the fifth circuit pattern, in a direction anti-parallel to the first direction.

17. The semiconductor device according to claim 13, wherein the first arm part and the second arm part are repeatedly and alternately arranged in a prescribed direction.

18. The semiconductor device according to claim 12, wherein:
the first semiconductor chip and the second semiconductor chip are reverse-conducting insulated gate bipolar transistors (RC-IGBTs); and
the first main current wire connects a plurality of points on each of the first main electrode and the second main electrode.

* * * * *